(12) United States Patent
Chuang et al.

(10) Patent No.: US 10,354,741 B2
(45) Date of Patent: Jul. 16, 2019

(54) LOW DISTORTION SAMPLE AND HOLD (S/H) CIRCUITS AND ASSOCIATED METHODS FOR USE WITH ANALOG-TO-DIGITAL CONVERTERS (ADCS)

(71) Applicant: Taiwan Semiconductor Manufacturing Company Limited, Hsinchu (TW)

(72) Inventors: Mei-Chen Chuang, Pingtung County (TW); Alan Roth, Leander, TX (US)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 16/135,053

(22) Filed: Sep. 19, 2018

(65) Prior Publication Data

US 2019/0096501 A1  Mar. 28, 2019

Related U.S. Application Data

(60) Provisional application No. 62/564,353, filed on Sep. 28, 2017.

(51) Int. Cl.
| | |
|---|---|
| *G11C 27/02* | (2006.01) |
| *H03M 1/46* | (2006.01) |
| *H03M 1/12* | (2006.01) |
| *H03M 3/00* | (2006.01) |
| *H03M 1/16* | (2006.01) |

(52) U.S. Cl.
CPC .......... *G11C 27/02* (2013.01); *G11C 27/026* (2013.01); *H03M 1/1245* (2013.01); *H03M 1/462* (2013.01); *H03M 3/426* (2013.01); *H03M 1/164* (2013.01); *H03M 1/46* (2013.01)

(58) Field of Classification Search
CPC ....... G11C 27/02; H03M 3/426; H03M 1/462; H03M 1/1245
USPC ........................................................ 341/122
See application file for complete search history.

(56) References Cited

U.S. PATENT DOCUMENTS

| | | | | |
|---|---|---|---|---|
| 9,692,442 | B1 * | 6/2017 | Kutz | H03M 1/124 |
| 9,782,588 | B2 * | 10/2017 | Shi | A61N 1/025 |
| 9,997,254 | B2 * | 6/2018 | Vilas Boas | G05F 3/24 |
| 10,115,475 | B2 * | 10/2018 | Gao | G11C 27/026 |

* cited by examiner

*Primary Examiner* — Brian K Young
(74) *Attorney, Agent, or Firm* — Jones Day (57) ABSTRACT

A sample and hold (S/H) circuit includes a capacitor coupling a sample node to a first voltage and an input line carrying a signal from an input. The S/H circuit also can include one or more transistors coupling the input line to the sample node. The S/H circuit also can include a switch coupled to one or more sources or drains of the one or more transistors and to a second voltage. The S/H circuit also can include a hold circuit coupled to the switch and to one or more gates of the one or more transistors, the hold circuit configured to open, during a sample period, the input line between the input and the sample node.

20 Claims, 8 Drawing Sheets

FIG. 9

LOW DISTORTION SAMPLE AND HOLD (S/H) CIRCUITS AND ASSOCIATED METHODS FOR USE WITH ANALOG-TO-DIGITAL CONVERTERS (ADCS)

CROSS-REFERENCE TO RELATED APPLICATIONS

This application claims priority to U.S. Provisional Patent Application No. 62/564,353, filed Sep. 28, 2017 and entitled "Low Distortion Sample and Hold," the entire contents of which are incorporated by reference herein.

FIELD

The technology described in this disclosure relates generally to sample and hold (S/H) circuits and associated methods, and more specifically to S/H circuits and associated methods and devices.

BACKGROUND

A sample and hold (S/H) circuit can receive an input voltage, sample and hold that voltage for a specified amount of time, and output the sampled and held voltage. S/H circuits can be incorporated into a variety of devices and circuits, such as devices that require a signal be held at a constant voltage for any period of time.

BRIEF DESCRIPTION OF THE DRAWINGS

Aspects of the present disclosure are best understood from the following detailed description when read with the accompanying figures. It is noted that, in accordance with the standard practice of the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

The present disclosure relates to devices, circuits, structures, and associated methods that are capable of providing low distortion sample-and-hold (S/H). A sample-and-hold circuit is capable of receiving a signal having a varying voltage level at an input and providing to an output a constant voltage for a desired period of time that corresponds a sampled voltage of the varying voltage level.

For example, certain circuits receive a varying voltage and perform an operation on a sample of the varying voltage, where those operation require a period of time (e.g. multiple clock cycles in a digital operation) to complete. Previously known solutions suffer for requiring differential inputs, or because due to their complexity process variations gave rise to coupling effects that could not be cancelled completely.

A S/H circuit can include a transistor that gates charge onto a potential energy storage element for storing energy in an electric field. Potential energy storage elements take many forms, non-limiting examples of which include voltage storage units or capacitive elements, such as thin film, film, aluminum, electrolytic, ceramic, tantalum, plastic, or silver mica type capacitors. When the gate is off, the capacitor stores the charge at a constant voltage. When the gate is on the voltage across the capacitor follows the input signal's varying voltage. This configuration is beneficial for its simplicity, but suffers because in high speed applications the input signal may be coupled to the S/H output voltage stored on the capacitor through parasitic capacitance of the metal routing as well as through drain-to-source capacitance (CDs) of the S/H transistor. This coupling causes variations in the S/H output that degrade the accuracy. Minimizing the effect of CDS in a gate transistor then is highly beneficial, because footprint of this simple form of S/H circuit is small and thus allows the S/H circuit to be arranged close to a follow-on device that receives the S/H circuits output, thereby minimizing metal routing capacitance arising between the S/H circuit and such a follow-on device.

For example, one type of device that may require multiple clock cycles to operate on a sampled voltage of an analog varying voltage signal is an analog-to-digital converter (ADCs). For one non-limiting example, certain known successive approximation register (SAR) ADCs can convert an analog signal to an n-bit digital word in n steps. For an accurate A-D conversion the voltage at the input of the ADC should be maintained at a constant level during the execution of the n steps. When variation occur in the S/H output the accuracy of the A-D conversion is degraded.

One method of minimizing the impact of the $C_{DS}$ on the S/H output is by increasing the on-resistance of the gate transistor, but this increased performance comes at the expense of increased power consumption of the ADC.

As provided herein, removing the coupling effect S/H circuits can reduce distortion. Reducing this distortion is desirable in advanced node or high precision analog circuits, and in fin field effect transistor (FINFET) processing, because of the low effect on the body of the device and due to the small footprint that is possible with S/H devices in accordance with this disclosure, due to the simplicity of its design. The details of the method, system, and device of the present disclosure are described in the attached disclosure and drawings.

It should be noted that the present technology is not limited to S/H circuits for use with ADCs such as SAR ADCs, but also is applicable to S/H circuits for use in any suitable type of circuit, device, or method. The S/H circuit of this disclosure may be employed in many configurations, and is compatible with both single and differential input configurations. In particular, some embodiments of the present invention remove the couple effect and also may be implemented regardless of whether an input is single or differential.

Figure 1:
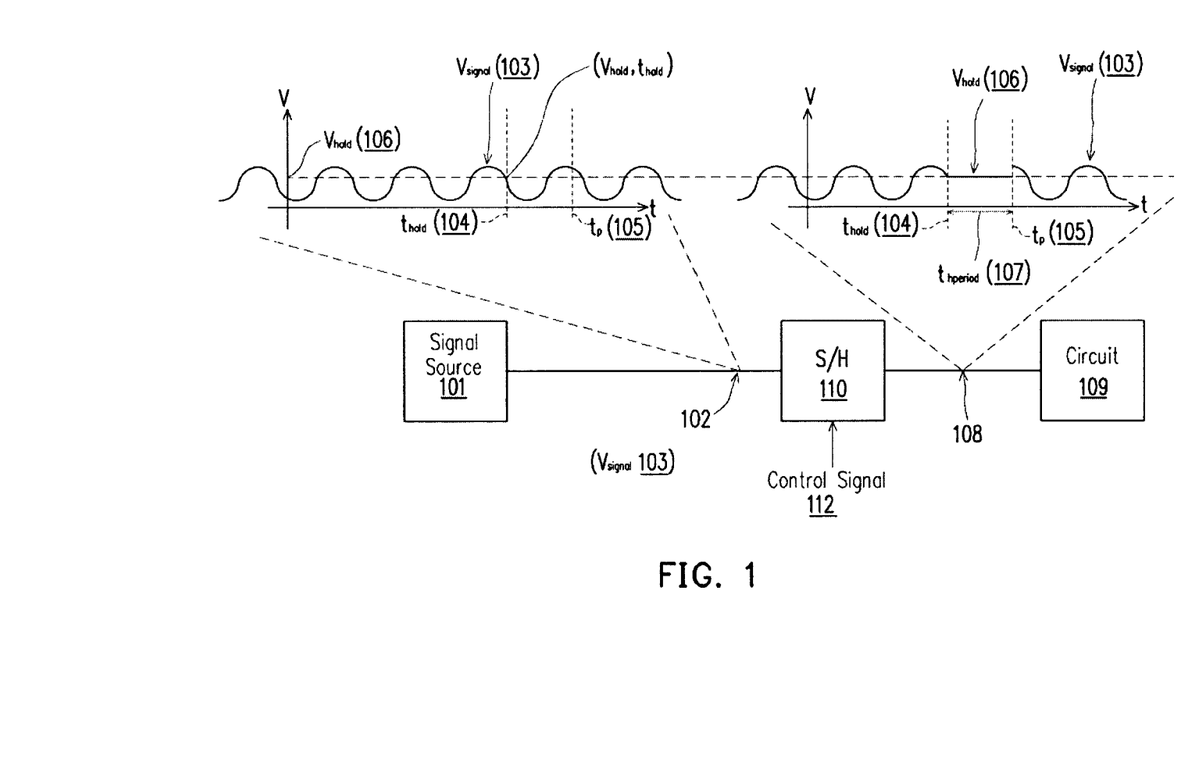
FIG. 1 illustrates an exemplary sample and hold circuit in accordance with some embodiments.

FIG. 1 depicts an exemplary use 100a of a sample and hold circuit 110 in accordance with embodiments. A signal source 101 may provide one or more signals that carry information, such as a voltage level or other information encoded in a time varying voltage, in a signal such as $V_{signal}$ 103. To obtain or evaluate the information carried on $V_{signal}$ 103 a circuit 109 may be employed to sense or sample the voltage provided by signal source 101 from time to time, for example on a periodic basis or in response to a trigger event elsewhere within larger circuit within which signal source 101 and circuit 109 cooperate.

In embodiments, for illustrative purposes, the signal $V_{signal}$ 103 is a periodic signal, or a superposition of many periodic signals (such as a square wave), a clock signal, an audio signal, a video signal, or the like. In other embodiments, $V_{signal}$ 103 is either high or low in response to other events occurring in a larger device or system, for example $V_{signal}$ 103 may be a trigger signal or an interrupt, in which case the signal may not be periodic and instead may be randomly asserted from the perspective of S/H 110. In general, $V_{signal}$ 103 may be any suitable signal for carrying information encoded in a desired manner. In cases, $V_{signal}$ 103 varies at frequencies that are much higher than the speed at which circuit 109 is able to reliably sample $V_{signal}$ 103 at a desired resolution. For example, $V_{signal}$ 103 may have variations occurring on the gigahertz or terahertz scale.

In embodiments, a sample and hold (S/H) circuit 110 may activate to hold output line 108 at a voltage, e.g. $V_{hold}$ 106, appearing at an input to S/H circuit 110 at a particular time, e.g. $t_{hold}$ 104, for a desired amount of time, e.g. period of time $t_{hperiod}$ 107. By holding line 108 at a voltage for a desired amount of time, S/H 110 thereby allows circuit 109 sufficient time to sample $V_{hold}$.

In one illustrative example, circuit 109 may be an ADC that converts $V_{hold}$ 106 to an n-bit digital word in n-steps, where each step may require one or more clock cycles of a clock signal received by circuit 109 (not particularly illustrated).

S/H circuit 110 receives one or more control signals 112, an input line 102 and an output line 108. S/H circuit 110 may receive an input signal, e.g. $V_{signal}$ 103, from a signal source 101 via input line 102 and provide an output, e.g. selectively either $V_{signal}$ 103 or $V_{hold}$ 106, to output line 108. In order to allow a circuit 109 to sample the voltage of $V_{signal}$ at a desired point in time, e.g. $t_{hold}$ 104, S/H circuit 110 first allows $V_{signal}$ 103 to pass uninterrupted to output line 108. Then at a desired time, e.g. $t_{hold}$ 104, S/H 110 holds a voltage, $V_{hold}$ 106, at output 108 until $t_p$ 105. In this way, S/H 110 provides $V_{hold}$ to circuit 109 for the duration of circuit 109's sampling or sensing period, $t_{period}$ 107, where $t_{period}$ 107 may be a difference between $t_p$ 105 and $t_{hold}$ 104. (It will be appreciated that S/H 110 may provide Vhold for any arbitrary amount of time, but, in some embodiments, at least as long as the sampling period required by circuit 109.)

Then at $t_p$ 105, S/H 110 again allows $V_{signal}$ 103 to pass uninterrupted such that after $t_p$ 105, $V_{signal}$ 103 appears again at output 108 until the next sample or sensing is desired.

S/H 100 may operate to hold a voltage, e.g. $V_{hold}$ 106, at a time, e.g. $t_{hold}$ 104, for a period of time, e.g. $t_{period}$ 107, responsive to control signal(s) 112. Control signal 112 may be a clock, an interrupt, or a trigger generated elsewhere within the larger circuit or system within which S/H 110, signal source 101, and circuit 109 cooperate. For one example, control signal 112 may originate in signal source 101 when signal source 101 wants to verify $V_{signal}$ 103 is output from signal source 101 correctly. In another example, control signal 112 may originate in circuit 109 in preparation for circuit 109 to take a sample of $V_{signal}$ 109. In other examples, control signal 112 originates independently of circuit 100a, for example in other control circuitry (not particularly illustrated in FIG. 1, but for example see control 230 illustrated in FIG. 2). For one example, control signal 112 may be a clock signal generated based on an external clock source.

One will appreciate that the term sampling period is used as one example of any suitable period of time for holding a voltage as dictated by the needs of the application. One will also appreciate that the time voltage plots illustrated in FIG. 1 are for the exemplary purpose of describing the voltages appearing at the input 102 and the output 108 of the S/H circuit 110, and are not intended to be limiting or to imply a particular structure of an embodiment.

Figure 2:
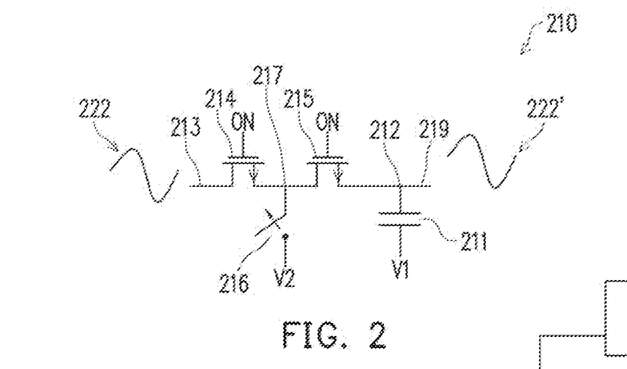
FIG. 2 depicts an example diagram of circuit components for use in a S/H circuit in accordance with some embodiments.
Figure 3:
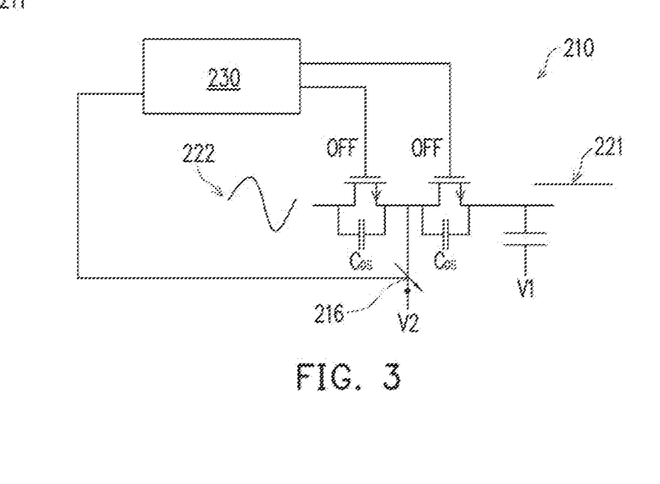
FIG. 3 depicts an example diagram of circuit components for use in a S/H circuit in accordance with some embodiments.

FIGS. 2-3 depict an example diagram of circuit components for use in a S/H circuit in accordance with some embodiments. S/H circuit 210 illustrated in FIGS. 2-3 can include capacitor 211 coupling sample node 212 to a first voltage V1, such as ground or any desirable reference voltage. Sample node 212 also is coupled to an output line 219 which can be coupled to other circuitry such as exemplified elsewhere herein. S/H circuit 210 also can include input line 213 carrying a signal from an input. S/H circuit 210 also can include one or more transistors coupling the input line 213 to the sample node 212, e.g., two transistors, three transistors, four transistors, or five or more transistors, etc. For example, the nonlimiting configuration illustrated in FIGS. 2-3 includes a pair of transistors 214, 215. Each of the transistors of S/H circuit 210 can be or include any suitable type of transistor, such as a metal oxide semiconductor field effect transistor (MOSFET), and independently can be or include a n-channel MOSFET (NMOS) or a p-channel MOSFET (PMOS).

In one nonlimiting example of S/H circuit 210, each of the transistors of S/H circuit 210 is an NMOS. S/H circuit 210 includes a switch 216 coupled between the source of NMOS 214 and drain of NMOS 215. For example, in the nonlimiting configuration illustrated in FIGS. 2-3, switch 216 is coupled to node 217 disposed between the source of first transistor 214 and the drain of second transistor 215. Switch 216 is also coupled to a second voltage V2, such as a ground or $V_{SS}$, or a suitable fixed voltage. Thus, when the switch is open and the transistor 214, 215 are on, sample node 212 receives an input signal applied to node 213 as if nodes 212 and 213 were connected by a wire. But, when switch 216 is closed and transistors 214 and 215 are off, node 212 is shielded from any parasitic currents passing through transistor 214 by switch 216 coupling node 217 to V2 (e.g. ground), while the voltage at node 212 is maintained by capacitor 211 which sees an open circuit to node 217 by virtue of transistor 215 being off. Switch 216 can include, for example, a field effect transistor having a gate coupled to a suitable control circuit or any suitable switching structure.

For example, still referring to FIGS. 2-3, S/H circuit 210 can include a hold circuit 230 coupled to switch 216 and to one or more gates of the one or more transistors, e.g., transistors 214, 215. The hold circuit 230 can be configured to short, during a sample period, the input line 213 between the input and the sample node 212. The hold circuit 230 may apply suitable voltages to gates of transistors 214, 215 to turn the transistors on, and to switch 216 to turn the switch off (e.g., hold the switch open). Accordingly, the voltage at sample node 212 follows the voltage on the input line 213, and is supported by capacitor 211. That is, as a signal varies at input line 213, that same signal appears at output line 219 when each transistor 214, 215 is on and switch 216 is open. The voltage appearing at output line 219 is supported by capacitor 211, such that when transistors 214, 215 are turned off, a sampled voltage is held on capacitor 211, while node 212 is shielded from parasitic currents through transistors 214, 215 when they are off by closing switch 216.

In FIG. 3, a hold period configuration is illustrated. Hold circuit 230 applies suitable voltages to the gates of transistors 214, 215 to turn the transistors off, and to switch 216 to turn the switch on (e.g., close the switch). That is, the voltage at node 217 is held steady at V2, which may be ground or any other suitable voltage, such that any parasitic currents induced through transistor 214 is dissipated into V2 and not through transistor 215. Accordingly, the input line 213 between the input and the sample node 212 is opened. Additionally, node 217 is coupled to V2, which can be a fixed voltage, thus shielding sample node 212 from fluctuations that otherwise may result from parasitic drain-source capacitance ($C_{DS}$) of the sampling transistors 214, 215. In embodiments where a state of node 213 is irrelevant other than during sensing periods, transistor 214 may be omitted, in which case node 213 is coupled to V2 during sample periods. In such a case, further control timing is necessary to open switch 216 prior to opening a path through transistor 215 to allow the voltage to be sensed to pass from 213 to 212, and to close switch 216 during sensing periods.

Without sample and hold circuit, a signal sampled during a sample period is distorted by parasitic currents arising from capacitance $C_{DS}$ of one or more input transistor in the input path to a sampled node causes the voltage at a sampling node (e.g. 212), which is typically supported by one or more capacitors, will fluctuate as the sampled signal continues to fluctuate creating a varying parasitic current into a sample node during a sample period. Whereas, S/H circuit 210 maintains a constant sampled voltage shielded from input parasitics at the sample node 212 during the hold period.

Figure 4A:
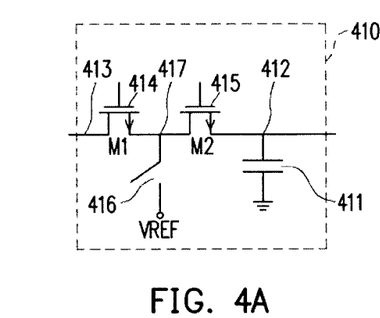
FIGS. 4A-4C depict example diagrams of circuit components of S/H circuits in accordance with some embodiments.
Figure 4B:
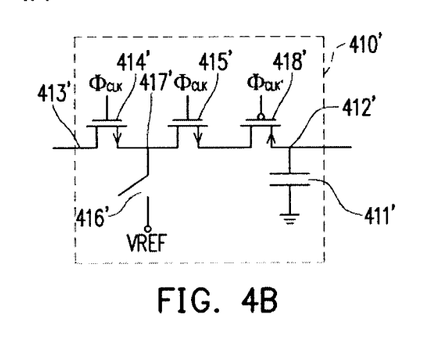
Figure 4C:
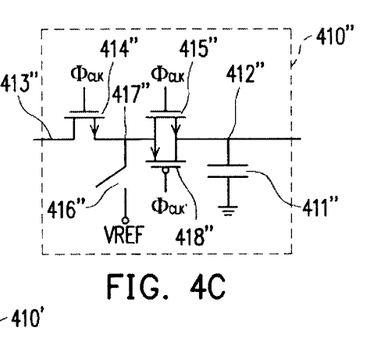

Referring again to FIGS. 2-3, it should be appreciated that S/H circuit 210 can have a variety of suitable configurations and can be coupled to a variety of suitable first and second voltages, V1 and V2, and can be used in a variety of different devices, circuits, and methods. For example V1 may be a reference voltage, a supply vlotage, a ground, or a fixed voltage. And V2 may be ground, a reference voltage or a supply voltage or any other suitable voltage depending on circuit design considerations. For example, FIGS. 4A-4C depict example, non-limiting, diagrams of circuit components of S/H circuits in accordance with some embodiments. In each case exemplary sample and hold circuits illustrated in FIGS. 4A-4C, may be employed respectively, as desired, in place of each of S/H circuits 510, 510', 510'', 610, 710, or 810 illustrated in FIGS. 5A-8.

S/H circuit 410 can be configured similarly as S/H 210 described above with reference to FIGS. 2-3. For example, S/H circuit 410 illustrated in FIG. 4A can include capacitor 411 coupling sample node 412 to a first voltage, such as ground. S/H circuit 410 also can include input line 413 carrying a signal from an input. S/H circuit 410 also can include first and second transistors 414, 415 coupling the input line 413 to the sample node 412. Transistor M1 414 and M2 415 may be or include any suitable type of transistor, such as MOSFET, e.g., NMOS or PMOS.

In one nonlimiting example, each of transistors M1 414 and M2 415 is an NMOS. S/H circuit 410 also can include switch 416, such as a field effect transistor, coupled to node 417 disposed between the drain of first transistor M1 414 and the source of second transistor M2 415. Switch 416 is coupled to a suitable reference voltage, referred to in FIG. 4A as VREF, which may be a reference voltage of an external circuit ground, or a suitable fixed voltage. Additionally, S/H circuit 410 can include a hold circuit (not specifically illustrated, but for example see hold circuit 230 of FIG. 3) coupled to switch 416 and to the gates of transistors M1 414 and M2 415 and configured to operate similarly as described above with reference to FIGS. 2-3. For example, the hold circuit can be configured to open, during a sample period, the input line 413 between the input and the sample node 412, e.g., by applying suitable voltages to the gates of transistors 414, 415 to turn the transistors off, and to switch 416 to turn the switch on (i.e. close the switch). The respective sizes of transistors M1 414 nd M2 415 may be different than one another depending on the design purpose of S/H circuit 410, or optionally may be the same as one another.

Optionally, the hold circuit 230 described above with reference to FIGS. 2-3 and 4A is configured in various applications to apply a differential signal to one or more of the transistors, such as a differential clock signal. For example, embodiments illustrated by S/H circuit 410' illustrated in FIG. 4B. S/H circuit 410' differs from S/H circuit 410 by including complementary MOS transistors controlled by a differential control signal. The configuration of FIG. 410' employ a dummy switch 418' of complementary MOS to transistor 415' to mitigate clock feedthrough, by employing differential clock signals $\Phi_{CLK}$, $\Phi_{CLK'}$ applied to complementary MOS transistors 415'(NMOS) and 418' (PMOS). When a clock rises or falls, clock feedthrough causes distortion in a voltage at output node 412 arising from gate to source capacitance $C_{GS}$ of a MOS device. By employing complementary logic this effect may is mitigated.

S/H circuit 410' also can include input line 413' carrying a signal from an input. S/H circuit 410' also can include first, second, and third transistors 414', 415', 418' coupling the input line 413' to the sample node 412'. Each of transistors 414', 415', 418' can be or include any suitable type of transistor, such as MOSFET, e.g., NMOS or PMOS. In one nonlimiting example, transistors 414'and 415'are NMOS and, 418' is a PMOS. The hold and/or clock circuit can be configured to open, during a sample period, the input line 413' between the input and the sample node 412', e.g., by applying suitable voltages to the gates of transistors 414', 415', 418' to turn one or more of the transistors off, and to switch 416' to turn the switch on. Illustratively, the hold and/or clock circuit can be configured to apply clock signal $\Phi_{CLK}'$ to first and second transistors 414', 415' and to apply inverse clock signal $\Phi_{CLK'}'$ to third transistor 418'. Accordingly, each of transistors 414', 415', and 418' may be turned off substantially simultaneously (accounting for any circuit delays or interruptions) and at the same time as switch 416' may be turned on to connect node 417' to VREF. In this case, node 417' is maintained at VREF thereby shielding node 412' from voltage variations on node 413 causing parasitic currents through transistor 414', and node 412' is maintained at the sampled voltage by capacitor 412' which experiences an open condition to node 417 held at VREF. And each of transistors 414', 415', 418' can be turned on substantially simultaneously and at the same time as switch 416' is turned off to disconnect node 417' from VREF, at which point, node 412' receives a varying voltage appearing on node 413' as if connected to node 413' by a wire. The respective sizes of transistors 414', 415', 418' can be different than one another depending on the design purpose of S/H circuit 410', or optionally can be the same as one another.

Alternative embodiments illustrated by S/H circuit 410" of FIG. 4C differs from S/H circuit 410' by configuring 415' and 418' as a transmission gate and is suitable for mitigating clock feedthrough, and has the added benefit of canceling charge injection. Similar to S/H circuit 410', S/H circuit 410" is also controlled by complimentary signals, e.g. as illustrated $\Phi_{CLK}$, $\Phi_{CLK"}$.

It should be appreciated that S/H circuits 210, 410, 410', and/or 410" can be used in a variety of different devices, circuits, and methods. In some nonlimiting configurations, the sample node of such S/H circuit(s) can be a display element node such as described below with reference to FIG. 6, can be sampled by a comparator such as described above with reference to FIG. 1b, can be sampled by an operational amplifier input such as described below with reference to FIGS. 5B-5C, or is provided as input to a stage of a pipeline analog-to-digital converter such as described below with reference to FIG. 7. In each of the following examples discussed in reference to FIGS. 5A-5C, 6, 7, as required by a designer according to design choices, any of S/H circuits 210, 410, 410', 410" may be employed in place of the S/H circuits illustrated within the dotted lines of each respective application illustrated in FIGS. 5A-5C, 6, 7. It will be appreciated that the exemplary S/H circuits described 210, 410, 410', 410" are not intended to be limiting, and it will be appreciated upon reading this disclosure that other configurations of S/H circuits are within the scope of this disclosure in view of the principles and techniques disclosed herein.

Figure 5A:
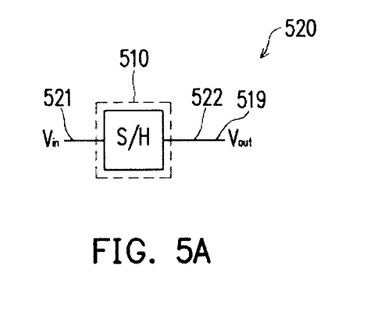
FIGS. 5A-5C depict example diagrams of devices that can include a S/H circuit in accordance with some embodiments.

For example, FIGS. 5A-5C depict diagrams of various exemplary devices that can include a S/H circuit in accordance with embodiments. In the nonlimiting example illustrated in FIG. 5A, S/H circuit 510, which can correspond to S/H circuit 210, 410, 410', or 410", is coupled between input line 521 carrying input voltage Vin and node 522 which is coupled to output line 519. Output line 519 outputs an output voltage $V_{out}$ supported by capacitor 411, 411', or 411" during a hold period. Capacitor 411, 411', or 411" can be coupled to ground or to other suitable voltage. And Vout may be supplied to any suitable load (e.g. an SAR ADC, a buffer, multistage buffers)

Figure 5B:
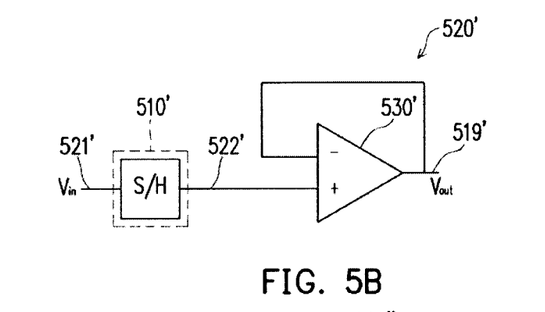

In the nonlimiting example illustrated in FIG. 5B, S/H circuit 510', which can correspond to S/H circuit 210, 410, 410', or 410", is coupled between input line 521' carrying input voltage Vin and node 522' which is coupled to a first input of operational amplifier 530' configured as a voltage buffer, for example an operational amplifier with negative feedback, such as in a voltage follower configuration, and to capacitor 411, 411', or 411". As one of skill in the art will appreciate, a voltage appearing at the non-inverting input of a voltage buffer will appear at the output of the voltage buffer 519' with a gain in current. This may be desirable where one wants to drive a subsequent circuit stage based on the voltage held at 522' by S/H circuit 510.

In the example illustrated operational amplifier 530' is in a voltage follower configuration, but it will be appreciated that any desired operational amplifier configuration may be utilized, and that the embodiments illustrated in FIG. 5B are for illustrative purposes only as the S/H circuit 510 may be utilized in cooperation with any desired circuit elements to obtain a desired effect. The output of operational amplifier 530' is coupled to output line 519' at which operational amplifier 530' outputs an output voltage Vout that follows the voltage at node 522', e.g. the output of the sample and hold circuit 510'. Capacitor 411, 411', or 411" (as the case may be) can be coupled to ground, or to other suitable voltage to bias the voltage sampled by operational amplifier 530' at 522'. In this way, a sampled $V_{in}$ held at node 522' by S/H 510' appears at Vout 519' with substantial current gain supported by op-amp 530' configured in a voltage buffer configuration as in circuit 520'.

Figure 5C:
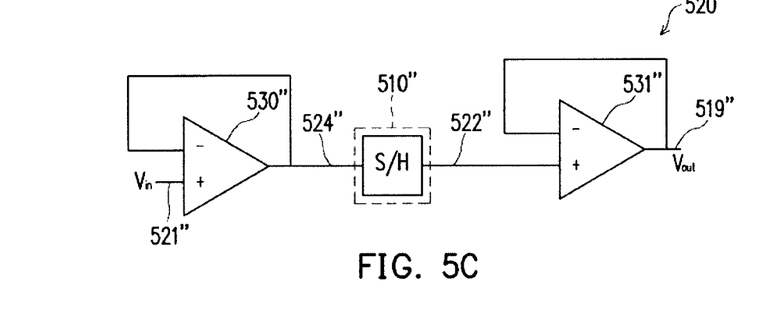

In the nonlimiting example illustrated in FIG. 5C, S/H circuit 510", which can correspond to S/H circuit 210, 410, 410', or 410", is coupled in a multi-stage circuit, such as a multistage voltage follower, between a first operational amplifier 530", configured in a first voltage follower sub-circuit, and a second operational amplifier 531", configured in a second voltage follower sub-circuit. A first input of first operational amplifier 530" is coupled to input line 521' carrying input voltage Vin. The output of first operational amplifier 530" is coupled to the second input of first operational amplifier 530", in a voltage buffer configuration, and also is coupled to line 524" which is coupled to the input of S/H circuit 510". The output of S/H circuit 510" is coupled to node 522" which is coupled to a first input of second operational amplifier 531". Thus, S/H circuit 510" provides a voltage appearing at line 521" to line 522" which serves as input into a second voltage buffer configured op-amp 531". The output of second operational amplifier 531" is coupled to the second input of second operational amplifier 531", and also is coupled to output line 519" at which second operational amplifier 531" outputs an output voltage Vout, which is $V_{IN}$ as sampled on node 524". Capacitor 411, 411', or 411" (as the case may be) can be coupled to ground or to other suitable voltage. In this way, $V_{in}$, with current gain from op-amp 530" is provided to S/H 510" for sampling and providing to node 522". This may be useful when the capacitance of S/H 510" is sufficiently large that signal $V_{IN}$ is unable to provide sufficient current to charge the respective capacitors. By using a voltage buffer, Vin remains undisturbed by the relatively large capacitances experienced by the output of op-amp 530".

Figure 6:
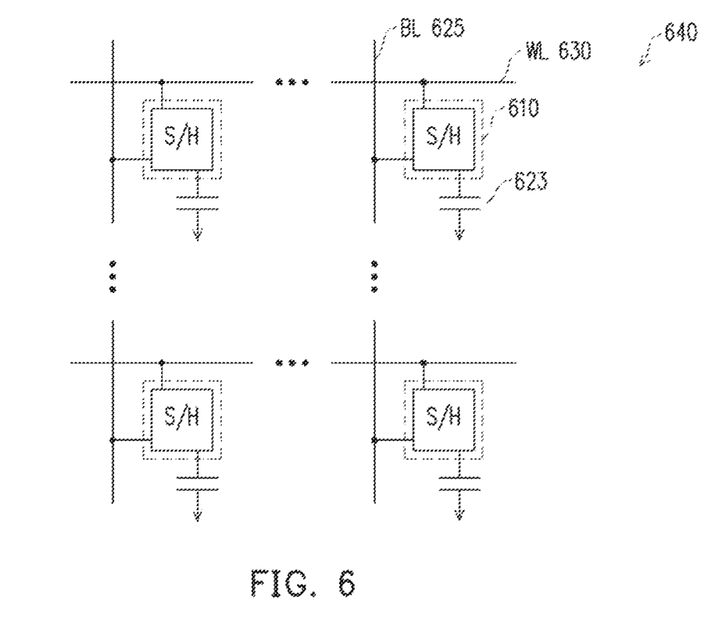
FIG. 6 depicts an example diagram of a device that can include a S/H circuit in accordance with some embodiments.

FIG. 6 depicts an example diagram of another illustrative device that can include a S/H circuit in accordance with some embodiments. Device 640 illustrated in FIG. 6 can correspond to a display device, such as a light emitting diode (LED) display panel. Device 640 can include a plurality of bit lines BL, e.g. BL 625, a plurality of word lines WL, e.g. WL 630, a plurality of capacitors 623, and a plurality of S/H circuit 610, each of which may take any suitable embodiment of S/H circuits in accordance with this disclosure, e.g. S/H circuit 610 may be any of S/H circuit 210, 410, 410', or 410" (details of S/H circuit 610 omitted for simplicity). In embodiments, either BL 625 or WL 630 operates as a control signal that initiates and terminates a sample period while S/H circuit maintains a voltage appearing on the other of either BL 625 or WL 630 on capacitor 623, which may drive one or more pixels of a display. Each S/H circuit 610 is coupled so as to receive an input voltage on a respective BL, with the gates of the one or more transistors (e.g. 414, 415, 418, 414', 415', 418', 414", 415", 418" as the case may be), and the switch (416, 416', 416" as the case may be) of each respective sample and hold circuit 610 controlled by a respective WL (either direct or by one or more additional logic gates not particularly illustrated), or an intervening control circuit actuated by a respective WL. The output of each S/H circuit 610 can be coupled to a node which is coupled to a respective capacitor 623.

Figure 7:
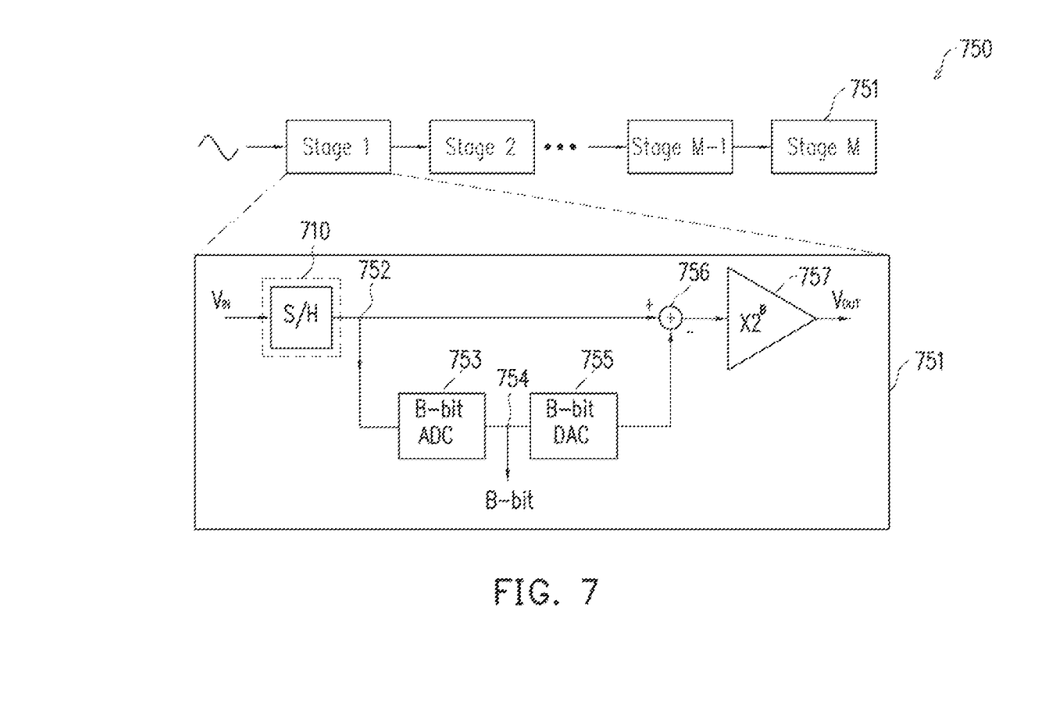
FIG. 7 depicts an example diagram of a device that can include a S/H circuit in accordance with some embodiments.

FIG. 7 depicts an example diagram of another illustrative device that can include a S/H circuit in accordance with some embodiments. Device 750 illustrated in FIG. 7 can include a S/H peripheral such as a pipeline ADC including a plurality of stages 1, 2, . . . M–1, M 751. In a pipeline ADC each successive stage approximates an input signal, e.g. $V_{in}$, at successively finer degrees of granularity. For example, if a digital word is 64 bits, and a pipeline ADC includes eight stages each of eight bits, the first stage, Stage 1, will approximate a signal appearing at node 752 using an eight bit ADC 753. This output will appear at an 8-bit node 754, which outputs the eight most significant bits of the desired 64 bit word describing signal Vin during a sample period. The first eight most significant bits are then input to a DAC 755 the output of which is subtracted from signal sampled on sample node 752 to obtain a remainder. This process is repeated in this example seven more times, for each stage and each stage receives a successively smaller input as the remained of the previous approximation, until after the eight stage, all 64 bits have been approximated by the pipleine ADC.

Each stage 751 can include S/H circuit 710 which can correspond to S/H circuit 210, 410, 410', or 410", first node 752, B-bit ADC 753, second node 754, B-bit DAC 755, arithmetic circuit 756, and amplifier 757. S/H circuit 710 can be coupled so as to receive an input voltage $V_{IN}$, and to provide an output to first node 752. First node 752 is coupled so to B-bit ADC and to arithmetic circuit 756. B-bit ADC 753 provides an output to second node 754, which outputs B bits and also is coupled to B-bit DAC 755. B-bit DAC 755 provides an output to arithmetic circuit 756, which subtracts the output of B-bit DAC 755 from the voltage received from first node 752 and provides its output to amplifier 757. The output of amplifier 757 is provided as the output of stage 751.

Thus, a sample and hold circuit in accordance with this disclosure is a circuit that allows a sampled signal at an input of the S/H circuit to appear without degradation due to input parasitics by shielding the sampled node. This is enabled by employing at least two transistors couple in series between the input node and the sampled node such that an electrical path between the input node and the sampled node flows through the channel of each transistor, and by selectively coupling a node between the two transistors to ground or VSS during a sample period.

Figure 8:
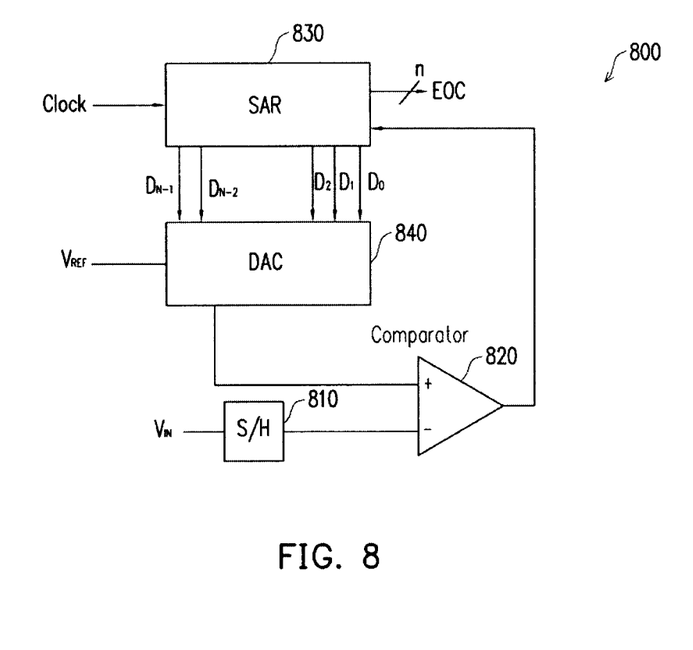
FIG. 8 depicts an example diagram of a successive approximation register (SAR) analog-to-digital converter (ADC) including a sample-and-hold (S/H) circuit in accordance with some embodiments.

FIG. 8 depicts an exemplary application of a sample and hold circuit in accordance with various embodiments. In configuration with an SAR ADC, a sample-and-hold circuit is used to maintain a voltage at the input of a successive approximation register (SAR) analog-to-digital converter (ADC) during a sampling period of the SAR ADC. An SAR ADC is a type of analog-to-digital converter that converts a continuous analog waveform into a discrete digital representation via a binary search through all possible quantization levels before converging on digital output for each conversion. For further details regarding an exemplary SAR ADC 800, see U.S. patent application Ser. No. 16/139,146, filed on Sep. 24, 2018 and entitled "Low Distortion Successive Approximation Register (SAR) Analog-to-Digital Converters (ADCs) and Associated Methods" or U.S. Provisional Patent Application No. 62/564,351, filed Sep. 28, 2017 and entitled "Low Distortion ADC Techniques," the entire contents of both of which are incorporated by reference herein.

In general SAR A-D conversion is a technique that is used in data acquisition applications, and may be employed in high-speed applications in particular. As described above an SAR ADC is able to convert an analog input voltage into an n-bit digital word approximating that voltage in n-steps. In certain designs, an SAR ADC is able to perform each step in one clock cycle, such that an SAR ADC converts the analog input into a digital approximation in n clock cycles.

In an SAR ADC 800, during each of n-steps, a successive approximation register (SAR) 830 individually compares an analog input voltage ($V_{IN}$) to a midpoint of one n ranges to determine a value of each bit in an n-bit digital word that approximates the analog input. For example, if the input voltage is higher than the midpoint of the range the bit is set to one, and if the input voltage is lower than the midpoint the corresponding bit is set to zero. This process is repeated n-times using n ranges to determine the n bits in the code.

An exemplary SAR ADC including a sample-and-hold (S/H) circuit in accordance with some embodiments. SAR ADC 800 includes S/H circuit 810, comparator 820, SAR 830, and digital to analog converter (DAC) 840. S/H circuit 810 receives as input an analog input voltage ($V_{IN}$) which is to be digitized, samples and holds that voltage for a specified amount of time, and outputs the sampled and held voltage. Comparator 120 can have an output, a first input, and a second input, and can include, for example, an operational amplifier. Comparator 120 can be coupled to S/H circuit 110 so as to receive the sampled and held voltage from the S/H circuit as a second input, and also can be coupled to DAC 140 from which comparator 120 receives an internal analog voltage from the DAC 840 at the first input that the comparator compares to the sampled and held voltage. The internal analog voltage from the DAC is generated by converting the digital word output of the SAR ($D_{N-1}$, $D_{N-2}$, . . . , $D_0$) to an analog voltage, which is the compared with $V_{IN}$. SAR cycles through combinations of digital words one word per step, and at each step the comparator compares the output of the DAC and $V_{IN}$ as explained further below.

SAR 830 is coupled to a source of a clock signal, as well as to comparator 120 so as to receive the output of the comparator's comparisons between the sampled and held voltage provided by S/H 810 and the internal analog voltage from DAC 840. By setting the MSB high, for example, and the remaining bits low, the DAC converts the SAR output to a mid-point voltage. $V_{REF}$ for example may be a maximum expected voltage of $V_{IN}$. (But it will be appreciated that $V_{REF}$ may be any suitable reference voltage as dictated by the design of the DAC and the expect range of $V_{IN}$.) In an exemplary embodiment, if the output of comparator 820 indicates that $V_{IN}$ is higher than $0.5*V_{REF}$, the SAR sets the MSB ($D_{N-1}$). Then the SAR proceeds to set the next bit, and the circuit 800 then determines if $V_{IN}$ is greater than or less than a midpoint between half $V_{REF}$ and $V_{REF}$ (i.e. 0.75 $V_{REF}$). If no, the next bit ($D_{N-2}$) is set to zero, and then the bit is tested to determine if VIN is greater or less than a midpoint voltage between $0.5*VREF$ and $0.75*V_{REF}$ (i.e. $0.625*V_{REF}$), and so on until all bits have been tested. After performing n such tests in n-steps the SAR DAC has converged on an approximation of $V_{IN}$. This process of converging on an approximation of $V_{IN}$ by testing each bit is referred to as a binary search through all possible values of an n-bit digital word. The final resulting n-bit sequence is the digital approximation of the sampled input signal, which sequence is then output by the SAR 130 at the end of conversion cycle (EOC). Because the binary search takes time (at least n-clock cycles), it may be the case that $V_{IN}$ varies faster than a conversion cycle of the SAR ADC, thus S/H 110 is used to maintain a sampled voltage During this process S/H 810 holds $V_{IN}$ at a constant voltage without variation caused by CDs of S/H 810 transistors. And because of the small footprint S/H 810 may be easily formed near the other components of SAR ADC 800 during semiconductor device process. This also enables designers to reduce parasitic capacitances in trace wires between S/H 810 and comparator 820.

Control circuitry (not specifically illustrated here, and sometimes referred to herein as a "hold circuit" or "hold and/or clock circuit", but see for example control circuitry 230 of FIG. 3), may include any suitable combination of hardware, e.g., a shift register block, control logic, and the like. Such control circuitry can be implemented using application specific integrated circuit (ASIC), field programmable gate array (FPGA), or the like. Alternatively, control circuitry may include software implemented by a data processing unit. In any case, the control circuitry can be coupled to each of S/H circuit 110, comparator 120, SAR 130, and/or DAC 140 and configured so as to perform suitable operations.

Figure 9:
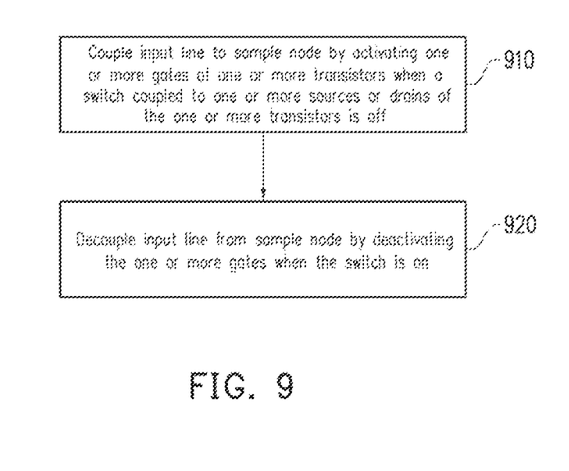
FIG. 9 depicts an example flow chart for performing a S/H method in accordance with some embodiments.

FIG. 9 depicts an example flow chart for performing a S/H method in accordance with some embodiments. S/H method 900 illustrated in FIG. 9 includes coupling an input line to a sample node by activating one or more gates of one or more transistors when a switch coupled to a node coupled to one or more sources or drains of the one or more transistors is off (910). For example, in S/H circuit 210 illustrated in FIGS. 2-3, the hold circuit can couple input line 213 to sample node 212 by activating gates 214, 215 when switch 216 is off. As another example, in S/H circuit 410 illustrated in FIG. 4A, the hold circuit can couple input line 413 to sample node 412 by activating gates 414, 415 when switch 416 is off. As another example, in S/H circuit 410' illustrated in FIG. 4B, the hold and/or clock circuit can couple input line 413' to sample node 412' by activating gates 414', 415' when switch 416 is off. As another example, in S/H circuit 410" illustrated in FIG. 4C, the hold and/or clock circuit can couple input line 413" to sample node 412" by activating gates 414", 415" when switch 416 is off.

Referring again to FIG. 9, method 900 can include decoupling the input line from the sample node by deactivating the one or more gates when the switch is on (920). For example, in S/H circuit 210 illustrated in FIGS. 2-3, the hold circuit can decouple input line 213 from sample node 212 by deactivating gates 214, 215 when switch 216 is on. As another example, in S/H circuit 410 illustrated in FIG. 4A, the hold circuit can decouple input line 413 from sample node 412 by deactivating gates 414, 415 when switch 416 is on. As another example, in S/H circuit 410' illustrated in FIG. 4B, the hold and/or clock circuit can decouple input line 413' from sample node 412' by deactivating gates 414', 415' when switch 416 is on. As another example, in S/H circuit 410" illustrated in FIG. 4C, the hold and/or clock circuit can decouple input line 413" from sample node 412" by deactivating gates 414", 415" when switch 416 is on.

In various options such as described in greater detail above, the sample node can be coupled to a capacitor, e.g., capacitor 211, 411, 411', or 411". Optionally, method 900 can include applying a first voltage to the capacitor, such as ground. As a further option, when the switch is on, a second voltage is applied to the node coupled to the one or more sources or drains. For example, the switch can couple the node to a supply voltage, ground, a reference voltage of an SAR circuit, or a fixed voltage. In one nonlimiting example, the first voltage is ground and the second voltage is ground. In other embodiments the second voltages is a supply voltage, a reference voltage of a successive approximation register (SAR) circuit, or any suitable voltage such as a fixed voltage as may be dictated by the particular design of the overall circuit. In non-limiting embodiments a fixed voltage is 1 mV, 30 mV, 600 mV, 900 mV, 1V, 3V, 5V, or 10V. In other non-limiting embodiments, such as in power electronics, the voltage maybe substantially higher. In embodiments, a reference voltage may be 1 mV, 30 mV, 600 mV, 900 mV, 1V, 3V, 5V, or 10V but in other applications a reference voltage may be orders of magnitude higher or lower as dictated by the application.

As provided herein, a low distortion S/H circuit includes a switch that decouples a first voltage, such as a sense voltage, from the gate capacitors to the voltage detector. The effect is to cancel the impact of coupling by connecting a node of the coupling path to a fixed voltage. One embodiment of a S/H circuit in accordance with the present disclosure is a sample node shunted to a ground via a capacitor that appears as an open circuit to high speed applications while supporting the voltage at the sample node during hold period. The sample signal is coupled to the sample node via one or more, e.g., a pair of, gating transistors coupled to a node in the sample path. The node in the sample path is tied to a second voltage, such as a supply voltage, ground, or fixed voltage, through a switch. In some embodiments, based upon the switch being off and the gates of the gating transistor(s) being on (e.g., based on operation by a hold circuit coupled to the switch and to the gates of the gating transistor(s)), the coupling between the node and ground is open thus allowing the signal to arrive uninterrupted in the sample mode. During sampling, the switch can be closed and the gates can be off, tying the node in the sample path to the second voltage (e.g., ground) thereby cutting off current flow through at least one the gating transistors and passing any current-associated parasitic capacitance to ground. In this way, the coupling effects can be negated, and the voltage at the sample node can be held at a constant voltage during the same period.

Accordingly, the present circuits, devices, and methods provide for S/H circuits with reduced distortion, for example, by inhibiting coupling of the input signal to the sampling node via drain-source capacitance through the sampling transistor(s). The circuits, devices, and methods can be implemented in a variety of manners, and can use single input or differential input.

In one embodiment, a sample and hold (S/H) circuit includes a capacitor coupling a sample node to a first voltage and an input line carrying a signal from an input. The S/H circuit also can include two transistors coupling the input line to the sample node. The S/H circuit also includes a switch coupled between the sources or drains of the two transistors and to a second voltage. The S/H circuit also can include a hold circuit coupled to the switch and to one or more gates of the two transistors, the hold circuit configured to open, during a sample period, the input line between the input and the sample node.

In another embodiment, a sample and hold (S/H) circuit can include a capacitor coupling a sample node to a first voltage, and an input line carrying a signal from an input. The S/H circuit also can include first and second transistors each coupling the input line to the sample node. The S/H circuit also can include a switch coupling a first node to a second voltage. The S/H circuit also can include a hold circuit coupled to the switch and to respective gates of the first and second transistors, the hold circuit configured to open, during a sample period, the input line between the input and the sample node. The first node can lie between the source of the first transistor and the drain of the second transistor. The switch can be configured to open during the sample period.

In yet another embodiment, a sample and hold (S/H) method includes coupling an input line to a sample node by activating one or more gates of one or more transistors when a switch coupled to a node coupled to one or more sources or drains of the one or more transistors is off. The S/H method also can include decoupling the input line from the sample node by deactivating the one or more gates when the switch is on.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

This written description and the following claims may include terms, such as "on," that are used for descriptive purposes only and are not to be construed as limiting. The embodiments of a S/H circuit, or device or circuit including such a S/H circuit described herein, can be manufactured, used, or shipped in a number of configurations.

What is claimed is:

1. A sample and hold (S/H) circuit comprising:
    a capacitive element coupling a sample node to a first voltage;
    two transistors coupling an input line to the sample node;
    a switch coupled between a source of a first one of the two transistors and a drain of a second one of the two transistors, the switch also coupled to a second voltage; and
    a hold circuit coupled to the switch and to one or more gates of the one or more transistors, the hold circuit configured to open, during a sample period, the input line between the input and the sample node, wherein the second voltage is a reference voltage of a successive approximation register (SAR) analog to digital converter (ADC) circuit.

2. The S/H circuit of claim 1, wherein the second voltage is ground or VSS.

3. The S/H circuit of claim 1, wherein the first voltage is ground or VSS.

4. The S/H circuit of claim 1, wherein the sample node is a display element node.

5. The S/H circuit of claim 1, wherein the sample node is sampled by a voltage follower.

6. The S/H circuit of claim 1, wherein the capacitive element is one of a thin film capacitor, a film capacitor, an aluminum capacitor, an electrolytic capacitor, a ceramic capacitor, a tantalum capacitor, a plastic capacitor, or a silver mica capacitor.

7. A sample and hold (S/H) circuit, comprising:
    a capacitive element coupling a sample node to a first voltage;
    an input line carrying a signal from an input;
    first and second transistors each coupling the input line to the sample node;
    a switch coupling a first node to a second voltage; and
    a hold circuit coupled to the switch and to respective gates of the first and second transistors, the hold circuit configured to open, during a sample period, the input line between the input and the sample node,
    wherein the first node lies between a source/drain of the first transistor and the drain of the second transistor, and
    wherein the switch is configured to open during the sample period, wherein the hold circuit is configured to apply a differential signal.

8. The S/H circuit of claim 7, wherein the hold circuit is configured to apply a differential clock signal.

9. The S/H circuit of claim 7, wherein the first voltage is ground.

10. The S/H circuit of claim 7, wherein the second voltage is VDD, ground, or a fixed voltage.

11. The S/H circuit of claim 7, wherein the first and second transistors have different sizes than one another.

12. The S/H circuit of claim 7, further comprising a third transistor coupled to the input line such that the third transistor and the first or second transistor form a transmission gate along the input line.

13. The S/H circuit of claim 7, wherein the sample node is provided as input to a stage of a pipeline analog-to-digital converter.

14. A sample and hold (S/H) method, comprising:
    coupling an input line to a sample node by activating or deactivating respectively each gate of one or more transistors when a switch is off, the switch coupled between a source of a first one of the two transistors and a drain of a second one of the two transistors, the switch also coupled to a second voltage; and
    decoupling the input line from the sample node by respectively deactivating or activating each of the two gates when the switch is on, wherein the sample node is a display element node.

15. The S/H method of claim 14, wherein the sample node is coupled to a capacitive element.

16. The S/H method of claim 15, comprising applying a first voltage to the capacitive element.

17. The S/H method of claim 16, wherein when the switch is on the switch is closed, a second voltage is applied to the node coupled to the one or more sources or drains.

18. The S/H method of claim 17, wherein the first voltage is ground, and wherein the second voltages is a supply voltage of a successive approximation register (SAR) circuit.

19. The S/H method of claim 17, wherein the first voltage is ground, and wherein the second voltages is a ground.

20. The S/H method of claim 17, wherein the first voltage is ground, and wherein the second voltages is a fixed voltage.

* * * * *